(12) United States Patent
Bilger et al.

(10) Patent No.: US 7,928,525 B2
(45) Date of Patent: Apr. 19, 2011

(54) INTEGRATED CIRCUIT WITH WIRELESS CONNECTION

(75) Inventors: Christoph Bilger, Munich (DE); Peter Gregorius, Munich (DE); Michael Bruennert, Munich (DE); Maurizio Skerlj, Munich (DE); Wolfgang Walthes, Munich (DE); Johannes Stecker, Munich (DE); Hermann Ruckerbauer, Moos (DE); Dirk Scheideler, Munich (DE); Roland Barth, Munich (DE)

(73) Assignee: Qimonda AG, Munich (DE)

( * ) Notice: Subject to any disclaimer, the term of this patent is extended or adjusted under 35 U.S.C. 154(b) by 317 days.

(21) Appl. No.: 12/109,558

(22) Filed: Apr. 25, 2008

(65) Prior Publication Data

US 2009/0267084 A1    Oct. 29, 2009

(51) Int. Cl.
*H01L 27/14* (2006.01)
*H01L 21/00* (2006.01)
*G08C 19/00* (2006.01)

(52) U.S. Cl. .................. 257/428; 438/57; 340/825.72

(58) Field of Classification Search .................. 257/428; 438/57; 340/10.1, 825.72

See application file for complete search history.

(56) References Cited

U.S. PATENT DOCUMENTS

| | | | | |
|---|---|---|---|---|
| 5,019,814 A * | 5/1991 | Biggs et al. | ............. | 340/870.29 |
| 5,335,361 A * | 8/1994 | Ghaem | ......................... | 455/501 |
| 5,362,961 A * | 11/1994 | Hamanaka | .................... | 250/216 |
| 5,621,913 A * | 4/1997 | Tuttle et al. | .................. | 455/41.2 |
| 5,754,948 A * | 5/1998 | Metze | .......................... | 455/41.2 |
| 5,767,789 A * | 6/1998 | Afzali-Ardakani et al. | . | 340/10.1 |
| 6,942,157 B2 * | 9/2005 | Nozawa et al. | ............... | 235/492 |
| 6,967,347 B2 * | 11/2005 | Estes et al. | ....................... | 257/25 |
| 7,050,763 B2 * | 5/2006 | Stengel et al. | ............... | 455/90.3 |
| 7,088,964 B2 * | 8/2006 | O | .................................. | 455/90.3 |
| 7,330,702 B2 * | 2/2008 | Chen et al. | ..................... | 455/73 |
| 7,379,713 B2 * | 5/2008 | Lindstedt | ..................... | 455/90.3 |
| 2005/0075080 A1 * | 4/2005 | Zhang | ............................ | 455/73 |
| 2006/0027646 A1 * | 2/2006 | Haberler | ....................... | 235/380 |
| 2006/0038138 A1 * | 2/2006 | Shin | ........................ | 250/492.21 |
| 2006/0131736 A1 * | 6/2006 | Jansman et al. | .............. | 257/712 |
| 2006/0289620 A1 * | 12/2006 | Yamamoto et al. | ............ | 235/375 |
| 2008/0024269 A1 * | 1/2008 | Watanabe et al. | ............. | 340/5.8 |
| 2008/0106469 A1 * | 5/2008 | Kikkawa et al. | ........ | 343/700 MS |
| 2008/0119135 A1 * | 5/2008 | Washiro | ....................... | 455/41.1 |
| 2009/0273560 A1 * | 11/2009 | Kalanithi et al. | ............. | 345/156 |

\* cited by examiner

*Primary Examiner* — W. David Coleman
(74) *Attorney, Agent, or Firm* — Edell, Shapiro & Finnan, LLC

(57) ABSTRACT

An integrated circuit includes a device stack including: a memory device with a first wireless coupling element, and a semiconductor device with a second wireless coupling element. The first and second wireless coupling elements are arranged face-to-face and are configured to provide a wireless connection between the memory device and the semiconductor device.

21 Claims, 6 Drawing Sheets

INTEGRATED CIRCUIT WITH WIRELESS CONNECTION

SUMMARY

An integrated circuit, a method for manufacturing an integrated circuit, a method of transferring data between a memory device and a semiconductor device, and a computer system are described herein. The integrated circuit comprises: a device stack including: a memory device and a semiconductor device. The memory device comprises a first wireless coupling element and the semiconductor device comprises a second wireless coupling element. The first and second wireless coupling elements are arranged face-to-face and are configured to provide a wireless connection between the memory device and the semiconductor device.

The above and still further features and advantages of the present invention will become apparent upon consideration of the following definitions, descriptions and descriptive figures of specific embodiments thereof, wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

The invention is explained in more detail below with reference to accompanying drawings, where.

DETAILED DESCRIPTION

In the following, embodiments of the invention are described. It should be noted that all embodiments described in the following may be combined in any way, i.e., there is no limitation that certain described embodiments may not be combined with others. Further, it should be noted that some reference signs throughout the figures denote same or similar elements. The drawings are not necessarily to scale.

Figure 1:
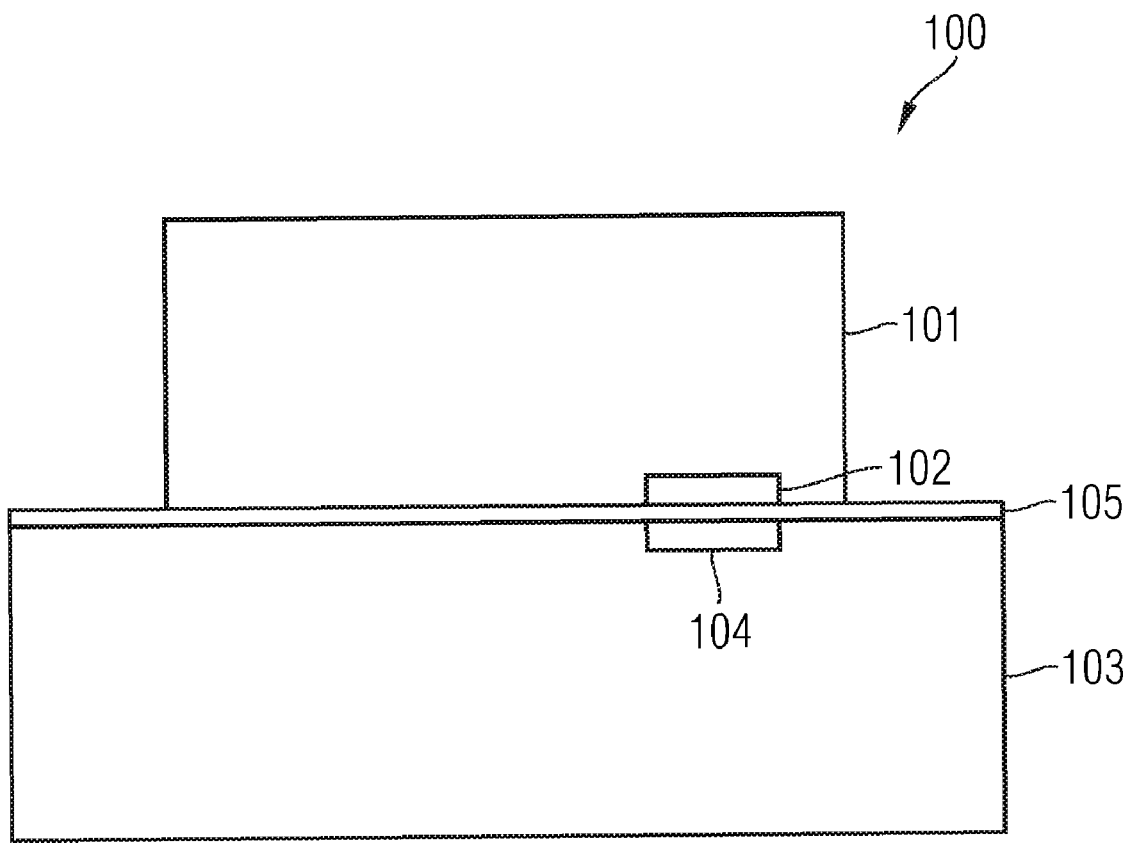
FIG. 1 shows a schematic cross-sectional view of an integrated circuit according to an embodiment.

FIG. 1 shows a schematic cross-sectional view of an integrated circuit 100 according to an embodiment. The integrated circuit 100 comprises a stack including: a memory device 101 and a semiconductor device 103, the memory device comprising a first wireless coupling element 102 and the semiconductor device 103 comprising a second wireless coupling element 104. A dielectric 105 may be arranged between the first wireless coupling element 102 and the second wireless coupling element 104, wherein the first and second wireless coupling elements 102, 104 are arranged face-to-face and are configured to provide a wireless connection between the memory device 101 and the semiconductor device 103.

As an example, the memory device 101 may be any of: volatile Random Access Memories (volatile RAM) (e.g., Static RAM (SRAM) and Dynamic Random Access Memories (DRAM)), non-volatile memories (e.g., Phase Change Random Access Memories (PCRAM)), Magnetic Random Access Memories (MRAM), Ferroelectric Random Access Memories (FRAM, FERAM), Semiconductor-Oxide-Nitride-Oxide-Semiconductor Memories (SONOS), Erasable Programmable Read-Only Memories (EPROM), Electrically Erasable Programmable Read-Only Memories (EEPROM) and Flash Memories (e.g., NOR or NAND type Flash Memories).

For example, the semiconductor device 103 may be a memory device of the same or different type as the memory device 101, a central processing unit, a memory controller or a memory buffer. However, the further semiconductor device 103 may be any other semiconductor device to which the memory device 101 may be electrically connected to. The dielectric 105 may include a plurality of dielectric layers. For example, the dielectric 105 may include a layer stack inclusive of imide layers. As an example, when placing devices 101, 103 with their outermost layer of imide face-to-face, an air gap may occur between the opposing imide layers. In this case, the outermost layer of imide of the memory device 101, the air gap and the outermost layer of imide of the semiconductor device 103 constitute the dielectric 105. As a further example, the dielectric 105 may include part of or all of successive dielectric layers provided in a wiring area formed above a surface of a semiconductor substrate of the device. It is to be noted that these successive dielectric layers may include insulating layers sandwiched between different metal layers in the wiring area but also further insulating layers used to isolate conductive lines within a same metal layer. For example, these dielectric layers may include intermetal dielectrics such as oxides formed by CVD (Chemical Vapor Deposition) or plasma CVD processes. Also, dielectric materials such as: oxides (e.g., $SiO_2$, $Al_2O_3$, $Ta_2O_5$, BSG (Boron Silicate Glass)), BPSG (Boron Phosphor Silicate Glass), SOG (Spin-On-Glass), and nitrides (e.g., $Si_3N_4$), may be used. However, any further dielectric may be used that is suited to enable a transmission of electromagnetic signals between the first wireless coupling element 102 and the second wireless coupling element 104, for example, any dielectric that does not have an undesirable or inadmissible absorption with regard to a wavelength range of the electromagnetic signals to be transmitted.

Apart from electric supply, any signals may be exchanged between the memory device 101 and the semiconductor device 103 via the wireless connection provided by the first wireless coupling element 102 and the second wireless coupling element 104. For example, these signals may include command signals, control signals, address signals, data signals, clock signals and any further signals involved in data communication with a memory device. It is to be noted that the provision of a single wireless coupling unit including the first wireless coupling element 102 and the second wireless coupling element 104, as is shown in FIG. 1, is to be considered as an illustrative example only and there may be provided multiple wireless coupling units including wireless coupling elements formed face-to-face in both the memory device 101 and the semiconductor device 103. For example, different wireless coupling units may be realized in order to transfer different signals such as clock signals and data signals. Hence the wireless connection is set up (i.e., provided) by at least one of: capacitive coupling, inductive coupling and optical coupling.

A method for transferring data between the memory device 101 and the semiconductor device 103 includes transferring data signals between the memory device and the semiconductor device by a wireless connection. The wireless coupling elements 102, 104 may be connected to a receiver circuit, a transmitter circuit or to a combined transmitter/ receiver circuit. For example, the wireless coupling elements 102, 104 may be formed within an active area of a semiconductor substrate of the device or they may be formed in a wiring area above a surface of the semiconductor substrate of the device. They may also be formed in both the semiconductor substrate and the wiring area.

Figure 2:
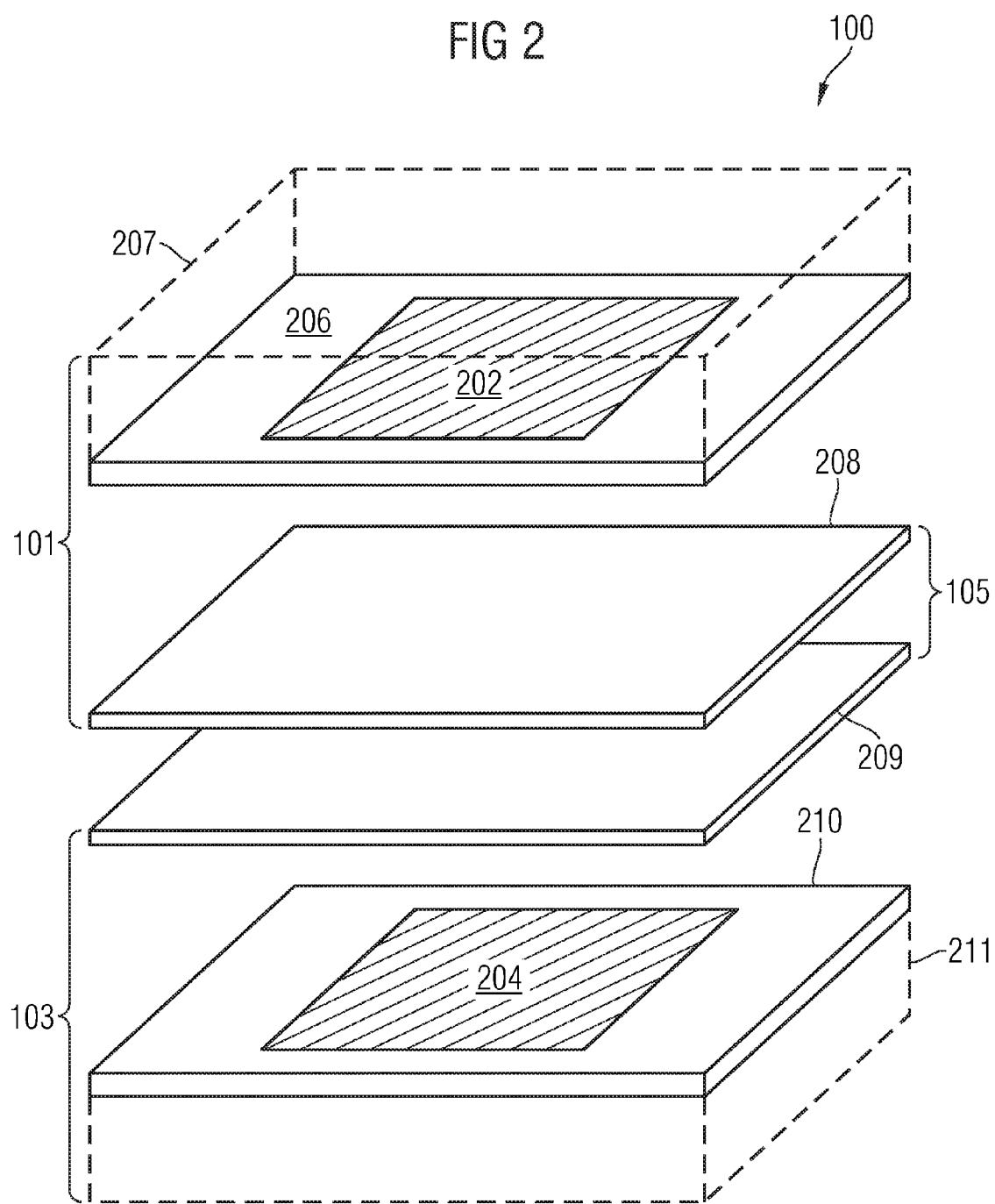
FIG. 2 shows a schematic view of a layer stack of an integrated circuit according to a further embodiment.

FIG. 2 shows a schematic view of a stack of layers of an integrated circuit 100 according to an embodiment. It is to be noted that FIG. 2 and also FIGS. 3, 4 merely show a section of the integrated circuit 100 in order to illustrate the wireless coupling unit in more detail. It is to be understood, however, integrated circuit 100 may include further circuit parts.

The memory device 101 includes a first wireless coupling element formed as a first capacitor plate 202. The first capacitor plate 202 may, as is shown in FIG. 2, be formed of an outermost metal layer in a wiring area of the memory device 101. This outermost metal layer may also be used for interconnection purposes with regard to further circuit parts of the memory device 101. The first capacitor plate 202 may be laterally surrounded by an insulating material 206. The memory device 101 is shown in a face-down position as a semiconductor substrate and further parts of the wiring area of memory device 101 are schematically outlined as a region 207.

The dielectric 105 may include a first dielectric layer 208 and a second dielectric layer 209. The first dielectric layer 208 may be formed on the first capacitor plate 202, whereas the second dielectric layer 209 may be formed on a second capacitor plate 204 of a second wireless coupling element of the semiconductor device 103. Similar to the first capacitor plate 202 of the memory device 101, the second capacitor plate 204 may be formed of an outermost metal layer of the wiring area of the semiconductor device 103. For example, any of first and second capacitor plates 202, 204 may be connected by vias to any further metal layer or these plates 202, 204 may also be connected by a wiring within the same metal layer.

An insulating material 210 may be provided laterally adjacent to the second capacitor plate 204 and the second capacitor plate 204 may be arranged on a region 211 including further parts of the semiconductor device 103, for example, additional wiring area such as inner metal layers and the semiconductor substrate. In the non-limiting illustrative view of FIG. 2 the semiconductor device 103 is arranged face-up. Hence, when considering a front side of a device as the side defined by a wiring area and a rear side of the device as the side defined by a semiconductor substrate, the memory device 101 and the semiconductor device 103 are brought together with regard to their front sides. When placing the first capacitor plate 202 and the second capacitor plate 204 face-to-face by bringing together the first dielectric layer 208 as an outermost dielectric layer of the memory device 101 and the second dielectric layer 209 as the outermost dielectric layer of the semiconductor device 103, an air gap might occur between the first and second dielectric layers 208, 209 (not shown in FIG. 2) of a further part of dielectric 105. This air gap may be ascribed to an unevenness of the outer surfaces brought together.

In the embodiment shown in FIG. 2, a wireless coupling between the memory device 101 and the semiconductor device 103 may be achieved by capacitive coupling provided by a capacitor constituting a wireless coupling unit, which comprises: the first capacitor plate 202, the dielectric 105, and the second capacitor plate 204. For example, materials for the first and second dielectric layers 208, 209 of dielectric 105 may not only be chosen with regard to common features of outermost dielectrics of semiconductor chips (e.g., with regard to chip protection capabilities) but also with regard to capabilities in view of beneficial capacitive coupling (e.g., with regard to high-k).

Figure 3:
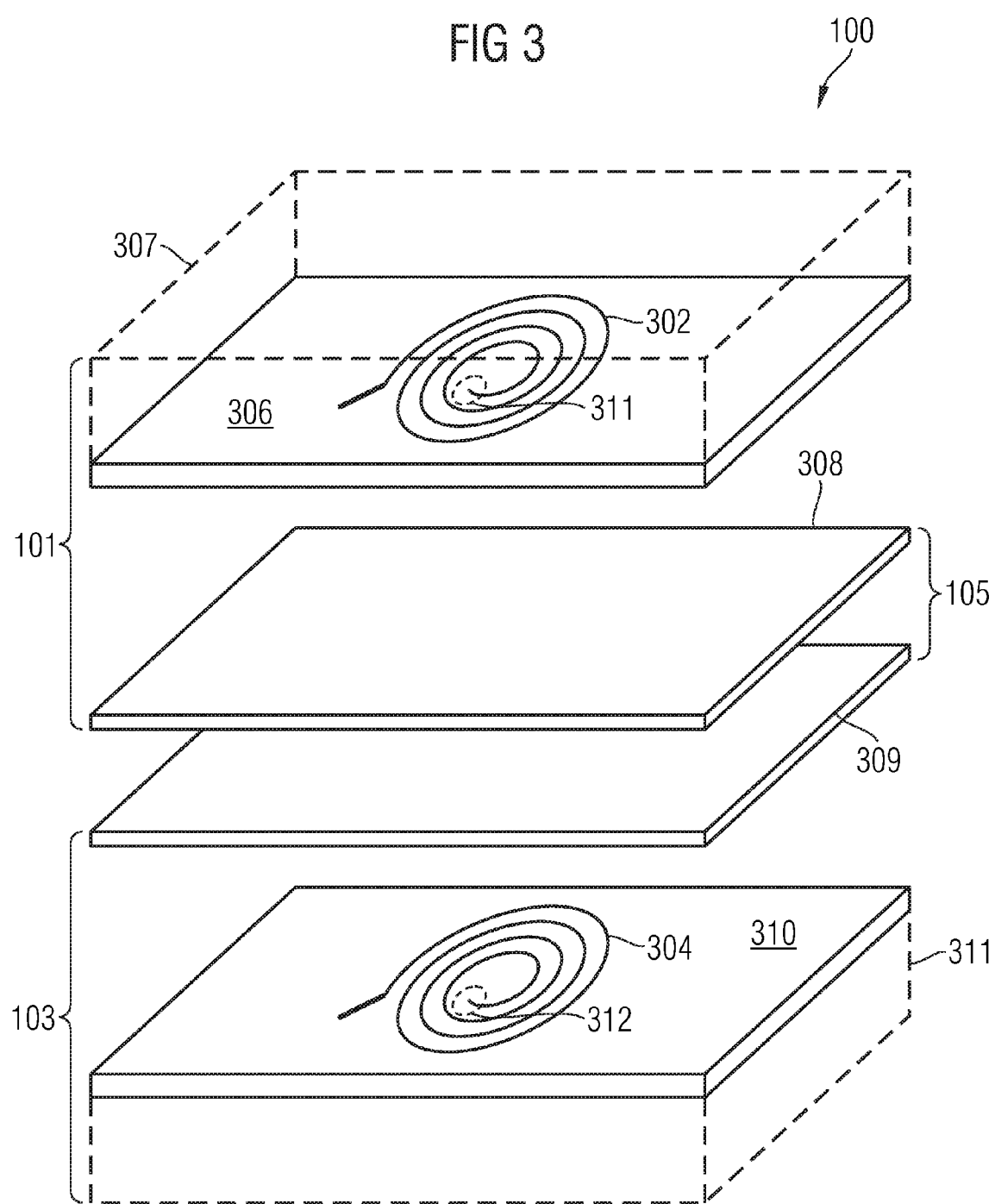
FIG. 3 shows a schematic view of a layer stack of an integrated circuit according to a further embodiment.

FIG. 3 shows a schematic view of a stack of layers of an integrated circuit 100 according to a further embodiment. The memory device 101 includes a first wireless coupling element formed as a first coil 302. The first coil 302 may be formed of an outermost metal layer of a wiring area of the memory device 101. This outermost metal layer may also be used for interconnection purposes with regard to further circuit parts of the memory device 101. The first coil 302 may be arranged on a region 311 laterally surrounded by an insulating material 306. The memory device 101 is shown in a face-down position as a semiconductor substrate and further parts of the wiring area of memory device 101 are schematically outlined as region 307.

The dielectric 105 may include a first dielectric layer 308 and a second dielectric layer 309. The first dielectric layer 308 may be formed on the first coil 302, whereas the second dielectric layer 309 may be formed on the second coil 304 of a second wireless coupling element of the semiconductor device 103. Similar to the first coil 302 of the memory device 101, the second coil 304 may be formed of an outermost metal layer of the wiring area of the semiconductor device 103. An insulating material 310 may be provided laterally adjacent to the second coil 304 and the second coil 304 may be arranged on a region 312 including further parts of the semiconductor device 103, for example, additional wiring area such as inner metal layers and the semiconductor substrate. In the non-limiting illustrative view of FIG. 3, the semiconductor device 103 is arranged face-up. Similarly to the embodiment shown in FIG. 2, when placing the memory device 101 and the semiconductor device 103 face-to-face by bringing together the first dielectric layer 308 as an outermost dielectric layer of the memory device 101 and the second dielectric layer 309 as the outermost dielectric layer of the semiconductor device 103, an air gap might occur between the first and second dielectric layers 308, 309 (not shown in FIG. 3) constituting a further part of the dielectric 105.

In the embodiment shown in FIG. 3, wireless coupling between the memory device 101 and the semiconductor device 103 may be achieved by inductive coupling provided by a wireless coupling unit which comprises the first coil 302, the dielectric 105 and the second coil 304. For example, materials for the first and second dielectric layers 308, 309 may not only be chosen with regard to common features of outermost dielectrics of semiconductor chips (e.g., with regard to chip protection capabilities), but also with regard to capabilities in view of beneficial inductive coupling (e.g., with regard to high magnetic permeability). For example, any of the first and second coils 302, 304 may not only be formed of an outermost metal layer of the respective device, but these coils may also include multiple coil sections interconnected by vias, whereas each coil section may be provided in a different metal layer. In this regard, connection areas 311, 312 of first and second coils 302, 304 may be contacted by a via connected to a further coil section or they may also be connected to a conductive line formed in a further metal layer, for example.

Figure 4:
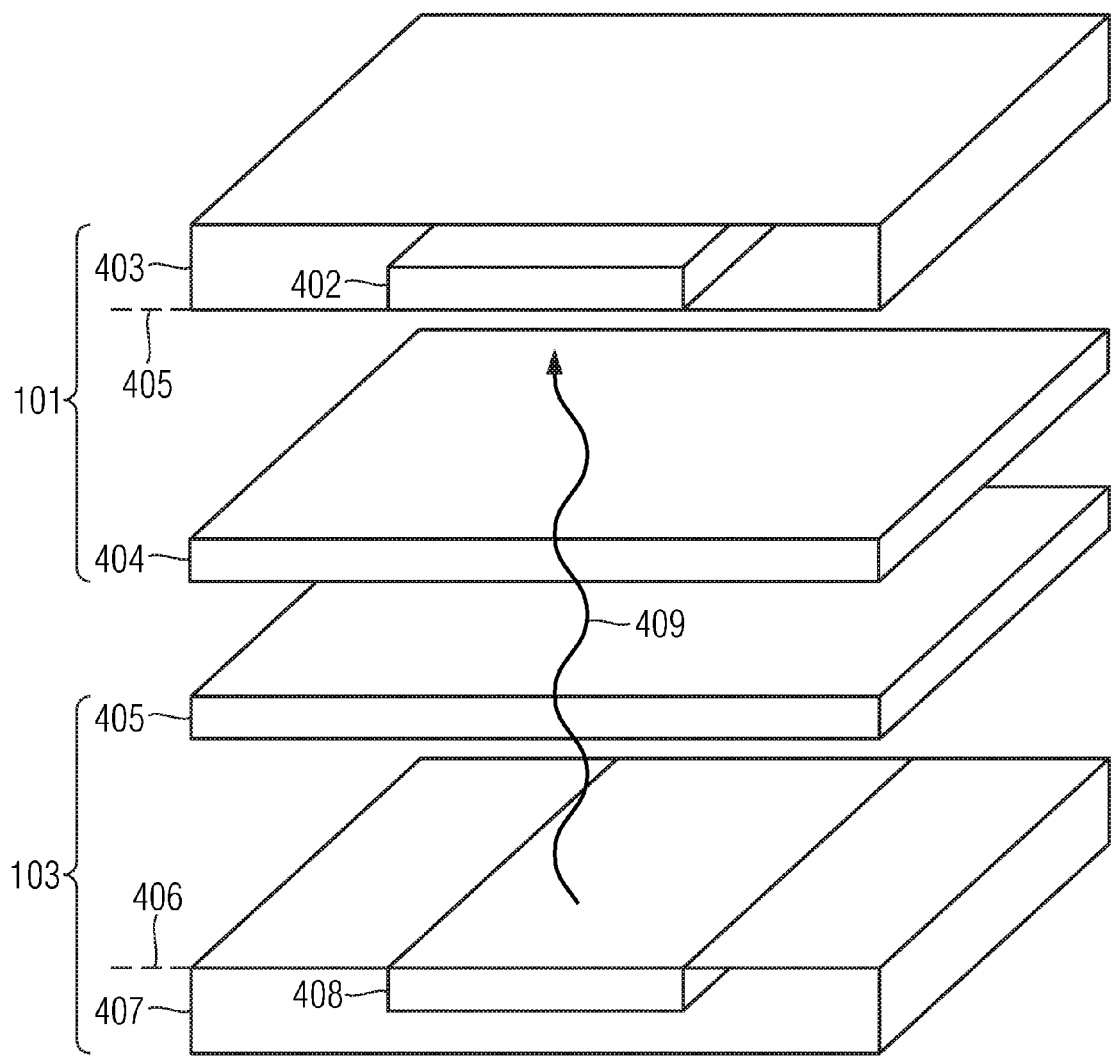
FIG. 4 shows a schematic view of a layer stack of an integrated circuit according to yet another embodiment.

FIG. 4 shows a schematic view of a layer stack of an integrated circuit 100 according to yet another embodiment. As a first wireless coupling element, a light receiving element 402 is formed within a semiconductor substrate 403 of the memory device 101. For example, the light receiving element 402 may be a photo diode. The memory device 101 furthermore includes a wiring area 404 arranged on a surface 405 of the semiconductor substrate 403. It is to be noted that in the non-limiting illustrative view of FIG. 4, the memory device 101 is arranged face-down. The wiring area 404 may comprise one or multiple metal layers electrically isolated by intermediate dielectric layers. The wiring area 404 is configured to interconnect different circuit parts formed within the semiconductor substrate 403 (e.g., provision of an interconnection between the light receiving element and a trigger circuit).

The semiconductor device 103 may also comprise a wiring area 405 including one or multiple metal layers electrically isolated by intermediate dielectric layers. The wiring area 405 is arranged on a surface 406 of a semiconductor substrate 407 of the semiconductor device 103. Within the semiconductor substrate 407, as a second wireless coupling element, a light emitting element 408 is arranged. For example, the light emitting element 408 may be a light emitting diode or a semiconductor laser diode. The arrangement of the first semiconductor device 103 is face-up, so that the light receiving element 402 of the memory device 101, which is arranged face-down, and the light emitting element 408 of the semiconductor device 103 may be brought together in a face-to-face position. Hence, wireless coupling between the memory device 101 and the further semiconductor chip 103 may be achieved by optical coupling as light 409 emitted from the light emitting element 408 of the semiconductor device 103 may be received by the light receiving element 402 of the memory device 101.

The materials of the dielectric layers within the wiring areas 404, 405 may be chosen as non-absorbing or weakly absorbing to a tolerable extent with regard to an emission wavelength of the light emitting element 408. Furthermore, the metal layers of the wiring areas 404, 405 should be appropriately patterned in order not to cross a light path from the light emitting element 408 to the light receiving element 402. It is to be understood that both the memory chip 101 and the further semiconductor chip 103 may include further light emitting elements and light receiving elements, for example, to set-up a bidirectional data transfer between the memory device 101 and the semiconductor device 103.

Figure 5:
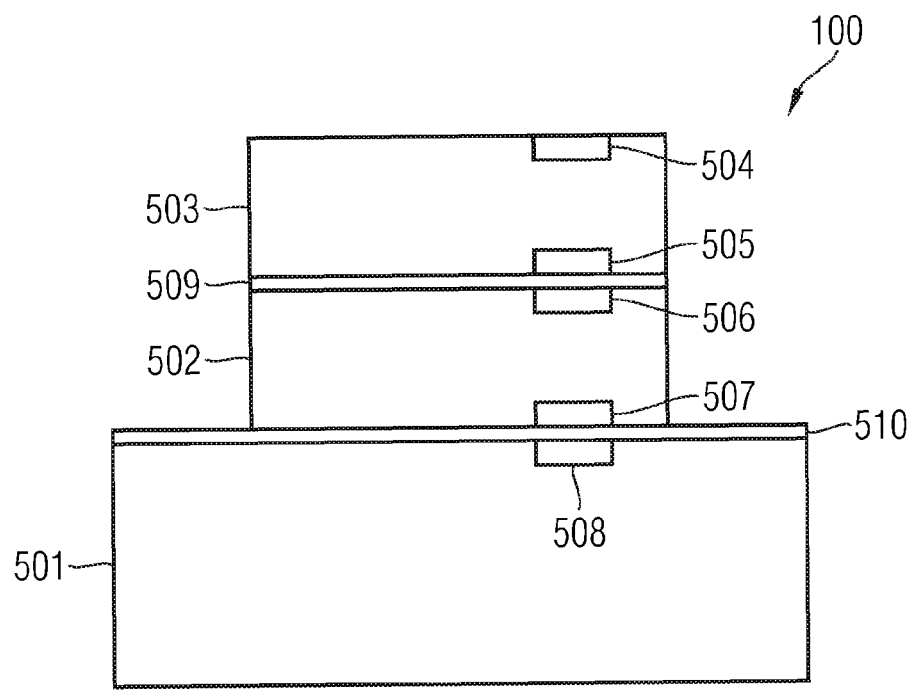
FIG. 5 is a schematic cross-sectional view illustrating an integrated circuit according to a further embodiment.

Referring to FIG. 5, a schematic cross-sectional view of an integrated circuit 100 according to a further embodiment is shown. The integrated circuit 100 comprises: a stack of a semiconductor device 501, a first memory device 502 arranged on the semiconductor device 501 and a second memory device 503 arranged on the first memory device 502. The memory devices 502, 503 are not only processed with regard to one surface side, but with regard to both opposing surface sides. Hence, semiconductor devices may be formed within active areas of opposing surface sides of the semiconductor substrates of the first and second memory devices 502, 503.

The first and second memory devices 502, 503 include wireless coupling elements on both surface sides. These wireless coupling elements are denoted by reference numerals 504, 505, 506 and 507. Wireless coupling elements 505, 506 of memory devices 503, 502 are arranged face-to-face including a dielectric 509 sandwiched there between. These coupling elements 505, 506 enable a wireless connection between the first memory device 502 and the second memory device 503. Furthermore, there is also arranged a wireless coupling element 508 within the semiconductor device 501, which is positioned face-to-face coupling element 507 of the first memory device 502. Similarly to coupling elements 505, 506, a dielectric 510 is sandwiched between the wireless coupling elements 507, 508. A wireless connection between the semiconductor device 501 and the first memory device 502 may be realized by wireless coupling elements 507, 508. For example, through-hole vias interconnecting opposing surface sides of memory devices 502, 503 (not shown in FIG. 5), may be formed within memory devices 502, 503 so that an interconnection between the second memory device 503 and the semiconductor device 501 may be realized.

Figure 6:
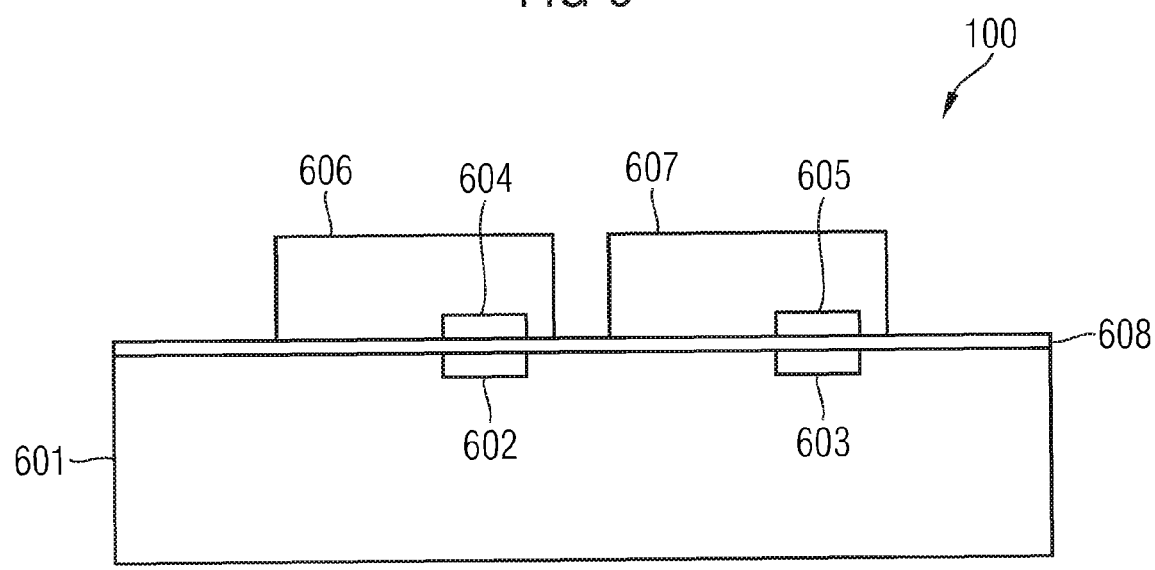
FIG. 6 is a schematic cross-sectional view illustrating an integrated circuit according to a further embodiment.

Referring to FIG. 6, a schematic cross-sectional view of an integrated circuit 100 according to a further embodiment is shown. The integrated circuit 100 comprises a semiconductor device 601 including wireless coupling elements 602, 603. The wireless coupling element 602 faces a wireless coupling element 604 formed within a first memory device 606, which is arranged face-down on the semiconductor device 601. Similarly, wireless coupling element 603 is arranged face-to-face with a wireless coupling element 605 of a second memory device 607. The second memory device 607 is also arranged face-down on the semiconductor device 601. Dielectric 608 may be sandwiched between the opposing wireless elements 604, 602 and 603, 605, respectively. For example, memory devices 606, 607 may be DRAM chips arranged on the semiconductor device 601, which may be a memory controller.

The stack of semiconductor devices shown in FIGS. 1-6 may be mounted in a chip-package, for example. Electric supply to the semiconductor devices may be provided via bond wires, solder bumps and through-hole vias, for example.

Figure 7:
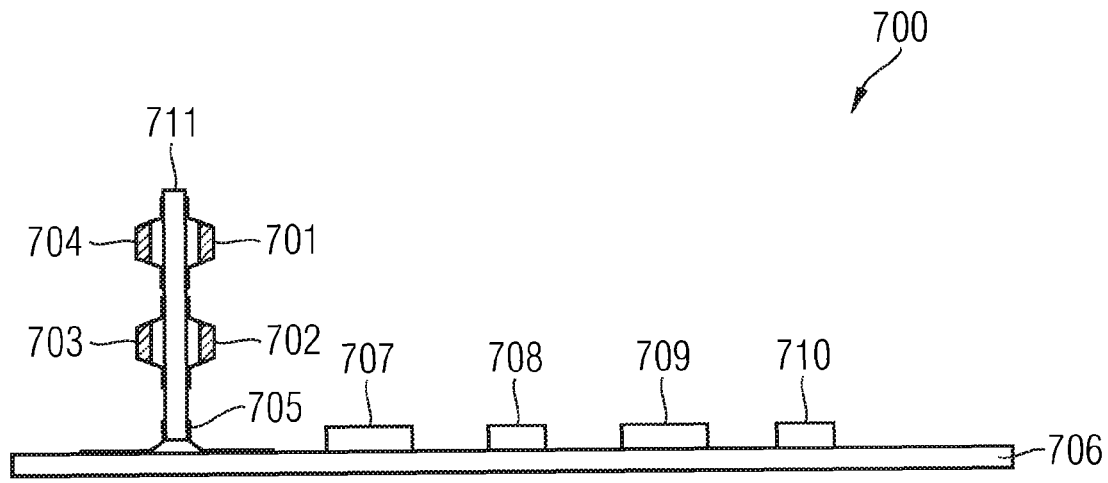
FIG. 7 shows a schematic view of a computer system according to an embodiment.

Referring to the schematic view of FIG. 7, a computer system 700 according to an embodiment is shown. For example, the computer system may be a personal computer, a work station or any other system manipulating data according to a list of instructions. The computer system 700 comprises an integrated circuit having a stack of semiconductor devices including wireless coupling elements configured to provide a wireless connection between the devices of the stack. For example, the stack of semiconductor devices may correspond to any of the embodiments illustrated in FIGS. 1-6. These integrated circuits may be placed in chip packages 701, . . . , 704 mounted on a printed circuit board 711. The printed circuit board 711 may be plugged into a slot 705 of a further circuit board 706. By way of example, the further circuit board 706 may be a motherboard or a backplane. On the circuit board 706, circuit board elements 707, . . . , 710 may be mounted. The circuit board elements 707, . . . , 710 may, for example, be sockets in which one or more CPUs may be installed, a chip set, memory chips, a clock generator, slots for expansion cards, or power connectors. The computer system 700 shown in FIG. 7 is to be considered merely as an example and in no way limiting. It is to be understood that any number of chip packages, slots or circuit board elements may be mounted on respective circuit boards. The memory devices may also be directly mounted on the motherboard, for example. The computer system 700 may also include further electronic components (e.g., hard disk drives) connected to the circuit board 706.

Figure 8:
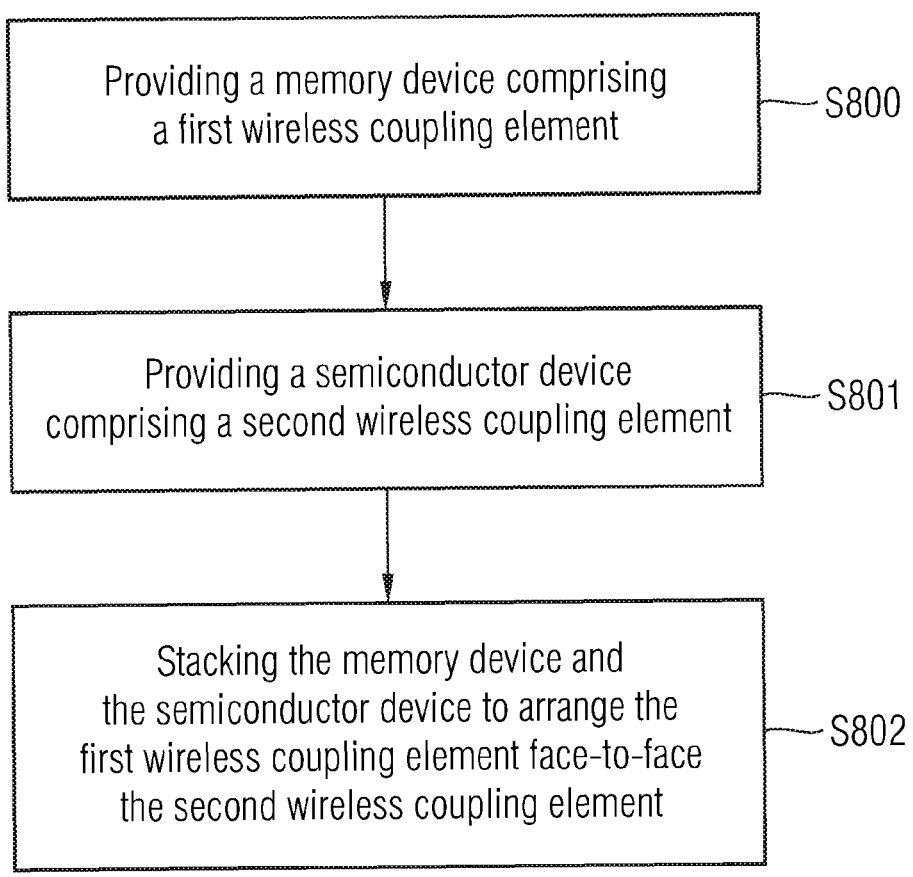
FIG. 8 shows a flowchart of a method for manufacturing an integrated circuit according to an embodiment.

In the schematic flowchart shown in FIG. 8, features of a method for manufacturing an integrated circuit according to an embodiment are described. In step S800, a memory device comprising a first wireless coupling element is provided. Then, in step S801, a semiconductor device comprising a second wireless coupling element is provided. Thereafter, in step S802, the memory device and the semiconductor device are stacked in a way that the first wireless coupling element is positioned face-to-face the second wireless coupling element. Optionally, a dielectric may be arranged between the memory device and the semiconductor device.

While the invention has been described in detail with reference to specific embodiments thereof, it will be apparent to one of ordinary skill in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. An integrated circuit, comprising:
   a device stack including:
      a memory device comprising a first wireless coupling element disposed beneath an outermost layer at a face of the memory device, the outermost layer of the memory device comprising a first dielectric layer; and
      a semiconductor device including a second wireless coupling element disposed beneath an outermost layer at a face of the semiconductor device, the outermost layer of the semiconductor device comprising a second dielectric layer;
   wherein the face of the memory device and the face of the semiconductor device are arranged face-to-face such that the first and second dielectric layers constitute first and second layers of a multi-layer dielectric between the first and second wireless coupling elements, and wherein the first and second wireless coupling elements are configured to transfer electromagnetic signals through the multi-layer dielectric to provide a wireless connection between the memory device and the semiconductor device.

2. The integrated circuit according to claim 1, wherein the first and second wireless coupling elements comprise capacitor plates.

3. The integrated circuit according to claim 1, wherein the first and second wireless coupling elements comprise coils.

4. The integrated circuit according to claim 1, wherein one of the first and second wireless coupling elements is a light emitting element and the other one of the first and second wireless coupling elements is a light receiving element.

5. The integrated circuit according to claim 1, wherein the semiconductor device is a memory device.

6. The integrated circuit according to claim 1, wherein the semiconductor device is one of: a central processing unit, a memory controller and a memory buffer.

7. The integrated circuit according to claim 1, wherein the memory device and the semiconductor device comprise wired connections for electric power supply.

8. The integrated circuit according to claim 1, further comprising:
   at least one further memory device including a third wireless coupling element; wherein:
   the semiconductor device further comprises a fourth wireless coupling element; and
   the third and fourth wireless coupling elements are arranged face-to-face and are configured to provide a further wireless connection between the memory device and the semiconductor device.

9. The integrated circuit according to claim 1, wherein the wireless connection is provided by at least one of: capacitive coupling, inductive coupling and optical coupling.

10. A computer system, comprising:
    the integrated circuit according to claim 1.

11. The integrated circuit according to claim 2, wherein the first capacitor plate is arranged in an outermost conductive layer of the memory device disposed beneath the outermost layer at the face of the memory device and the second capacitor plate is arranged in an outermost conductive layer of the semiconductor device disposed beneath the outermost layer at the face of the semiconductor device.

12. The integrated circuit according to claim 3, wherein the first coil is formed in an outermost conductive layer of the memory device disposed beneath the outermost layer at the face of the memory device and the second coil is formed in an outermost conductive layer of the semiconductor device disposed beneath the outermost layer at the face of the semiconductor device.

13. The integrated circuit according to claim 4, wherein:
    the memory device further comprises a third wireless coupling element; and
    the semiconductor device further comprises a fourth wireless coupling element arranged face-to-face with the third wireless coupling element with the multi-layer dielectric sandwiched there between, the third wireless coupling element being of a same type as the second wireless coupling element and the fourth wireless coupling element being of the same type as the first wireless coupling element.

14. The integrated circuit according to claim 7, wherein the wired connections are at least one of: bond wires, solder balls and through-hole vias.

15. The integrated circuit according to claim 1, further comprising:
    a further memory device stacked on the memory device and including a third wireless coupling element disposed beneath an outermost layer at a face of the further memory device, the outermost layer of the further memory device comprising a third dielectric layer; wherein:
    the memory device wirelessly connected to the semiconductor device further comprises a fourth wireless coupling element disposed beneath an outermost layer at a further face of the memory device wirelessly connected to the semiconductor device, the outermost layer of the further face of the memory device comprising a fourth dielectric layer; and
    wherein the face of the further memory device and the further face of the memory device wirelessly connected to the semiconductor device are arranged face-to-face such that the third and fourth dielectric layers constitute layers of a second multi-layer dielectric between the third and fourth wireless coupling elements, and wherein the first and second wireless coupling elements are configured to transfer electromagnetic signals through the multi-layer dielectric to provide a wireless connection between the memory device wirelessly connected to the semiconductor device and the further memory device.

16. A method for transferring data between a memory device and a semiconductor device, the memory device including a first wireless coupling element disposed beneath a first dielectric layer on an outer face of the memory device, the semiconductor device including a second wireless coupling element disposed beneath a second dielectric layer on an outer face of the semiconductor device, the first and second dielectric layers being arranged to form layers of a multi-layer dielectric, the method comprising:

transferring electromagnetic data signals between the first wireless coupling element of the memory device and the second wireless coupling element of the semiconductor device via a wireless connection such that the electromagnetic data signals are conveyed through the multi-layer dielectric comprising the first and second dielectric layers.

17. The method of claim 16, wherein the wireless connection is provided by at least one of: capacitive coupling, inductive coupling and optical coupling.

18. A method for manufacturing an integrated circuit, the method comprising:

providing a memory device including a first wireless coupling element disposed beneath an outermost layer at a face of the memory device, the outermost layer of the memory device comprising a first dielectric layer;

providing a semiconductor device including a second wireless coupling element disposed beneath an outermost layer at a face of the semiconductor device, the outermost layer of the semiconductor device comprising a second dielectric layer; and stacking the memory device and the semiconductor device with the face of the memory device and the face of the semiconductor device being arranged face-to-face such that the first and second dielectric layers constitute first and second layers of a multi-layer dielectric between the first and second wireless coupling elements, the first and second wireless coupling elements being arranged to transfer electromagnetic signals through the multi-layer dielectric to provide a wireless connection between the memory device and the semiconductor device.

19. The method according to claim 18, wherein the first and second wireless coupling elements are formed as capacitor plates.

20. The method according to claim 18, wherein the first and second wireless coupling elements are formed as coils.

21. The method according to claim 18, wherein one of the first and second wireless coupling elements is a light emitting element and the other one of the first and second wireless coupling elements is a light receiving element.

* * * * *